United States Patent
Gomez et al.

(10) Patent No.: US 7,084,720 B2
(45) Date of Patent: Aug. 1, 2006

(54) PRINTED BANDPASS FILTER FOR A DOUBLE CONVERSION TUNER

(75) Inventors: Ramon A. Gomez, San Juan Capistrano, CA (US); Lawrence M. Burns, Laguna Hills, CA (US); Sung-Hsien Chang, Irvine, CA (US); Carl W. Pobanz, Topanga, CA (US)

(73) Assignee: Broadcom Corporation, Irvine, CA (US)

( * ) Notice: Subject to any disclaimer, the term of this patent is extended or adjusted under 35 U.S.C. 154(b) by 0 days.

(21) Appl. No.: 10/040,376

(22) Filed: Jan. 9, 2002

(65) Prior Publication Data

US 2003/0128085 A1 Jul. 10, 2003

(51) Int. Cl.
*H01P 1/20* (2006.01)

(52) U.S. Cl. ............... 333/204; 333/219; 333/185; 333/167

(58) Field of Classification Search ........... 333/204, 333/202, 219, 175, 185, 167, 170; 455/338, 455/339, 323, 191.1
See application file for complete search history.

(56) References Cited

U.S. PATENT DOCUMENTS

| | | | |
|---|---|---|---|
| 4,418,324 A | | 11/1983 | Higgins |
| 4,423,396 A | * | 12/1983 | Makimoto et al. .......... 333/204 |
| 4,488,130 A | * | 12/1984 | Young et al. ............... 333/203 |
| 4,740,765 A | | 4/1988 | Ishikawa et al. |
| 4,757,285 A | * | 7/1988 | Krause .................... 333/203 |
| 4,801,905 A | * | 1/1989 | Becker ..................... 333/238 |
| 4,881,043 A | | 11/1989 | Jason |

(Continued)

FOREIGN PATENT DOCUMENTS

| | | |
|---|---|---|
| EP | 0 506 476 A1 | 9/1992 |
| JP | 5-308204 A | 11/1993 |
| JP | 8-65007 A | 3/1996 |
| JP | 11-317603 A | 11/1999 |

OTHER PUBLICATIONS

Kuo, J.–T., et al., "Microstrip Elliptic Function Filters with Compact Miniaturized Hairpin Resonators," IEEE, pp. 861–864 (1999).
European Patent Office English–language Abstract for JP 05308204, published Nov. 19, 1993, 1 page.
European Patent Office English–language Abstract for JP 08065007, published Mar. 8, 1996, 1 page.
European Patent Office English–language Abstract fo JP 11317603, published Nov. 16, 1999, 1 page.
European Search Report from European Patent Application No. 03250090.2, dated Jan. 14, 2004, 3 pages.
GIL Technologies, *GML 1000 High Frequency Laminate*, at http://www.shfmicro.com/gil20.pdf, 1 page (date unknown).
Matthaei, G. et al., *Microwave Filters, Impedance–Matching Networks and Coupling Structures*, Artech House, Inc., entire book submitted (1980).

*Primary Examiner*—Robert Pascal
*Assistant Examiner*—Kimberly Glenn
(74) *Attorney, Agent, or Firm*—Sterne Kessler Goldstein & Fox PLLC

(57) ABSTRACT

A printed bandpass filter is mounted on a precision substrate to eliminate the need for post-fabrication tuning. The filter input is capacitively coupled to a series of quarter wavelength resonators and the filter output. The quarter wavelength resonators are printed as spirals to reduce filter size. The resonators define the bandpass characteristics of the filter. The filter also weakly couples the input signal to the filter output in a manner to cancel the signal image. Mechanical clips mitigate thermal stress on solder connections when the precision substrate is mounted on a second printed circuit board.

17 Claims, 9 Drawing Sheets

U.S. PATENT DOCUMENTS

| | | | |
|---|---|---|---|
| 5,192,926 A * | 3/1993 | Sogo et al. | 333/204 |
| 5,739,193 A | 4/1998 | Walpita et al. | |
| 5,825,263 A | 10/1998 | Falt | |
| 5,896,073 A | 4/1999 | Miyazaki et al. | |
| 5,949,295 A | 9/1999 | Schmidt | |
| 5,955,931 A | 9/1999 | Kaneko et al. | |
| 5,986,525 A | 11/1999 | Sasaki et al. | |
| 6,100,761 A | 8/2000 | Ezell | |
| 6,108,569 A * | 8/2000 | Shen | 333/204 |
| 6,130,189 A | 10/2000 | Matthaei | |
| 6,130,591 A | 10/2000 | Tsuzuki | |
| 6,191,665 B1 * | 2/2001 | Chan et al. | 333/175 |
| 6,252,476 B1 | 6/2001 | Maloratsky | |
| 6,259,752 B1 * | 7/2001 | Domino et al. | 455/283 |
| 6,288,609 B1 | 9/2001 | Brueske et al. | |
| 6,411,181 B1 | 6/2002 | Ishikawa et al. | |
| 6,438,394 B1 * | 8/2002 | Zhang | 333/175 |
| 6,448,640 B1 | 9/2002 | Corisis | |
| 6,448,873 B1 * | 9/2002 | Mostov | 333/185 |
| 6,486,754 B1 * | 11/2002 | Hidaka et al. | 333/219 |
| 6,496,710 B1 | 12/2002 | Tsuzuki | |
| 6,522,217 B1 * | 2/2003 | Shen | 333/99 S |
| 6,597,265 B1 | 7/2003 | Liang et al. | |
| 6,639,909 B1 | 10/2003 | Sakuma | |
| 6,771,774 B1 | 8/2004 | Phan et al. | |

* cited by examiner

PRINTED BANDPASS FILTER FOR A DOUBLE CONVERSION TUNER

BACKGROUND OF THE INVENTION

1. Field of the Invention

The present invention relates generally to radio frequency signal filters, and more specifically to printed circuit bandpass filters.

2. Background Art

Television tuners can be classified by the type of circuit used to select the desired television channel. The predominant circuit architectures in use today are single-conversion and double-conversion television tuners.

Single conversion tuners usually require preselection filtering. The preselector must be a tracking bandpass filter in order to reject the image channel, which occurs at twice the intermediate frequency (IF) away from the desired television channel frequency. Tracking filters require expensive manual tuning during the assembly process. Tracking filters can have significant variations in amplitude response over the desired television channel bandwidth. These variations are undesirable in both analog and digital television systems. Tracking filters are also particularly difficult to implement at the upper end of the television band, where the difference between the desired television channel frequency and the image frequency is a small fraction of the desired television frequency. Removing the image channel, under these conditions, requires a bandpass filter with high selectivity.

Double-conversion tuners convert the incoming television signal to a high IF, where most of the out-of-band signals are removed by a narrow bandpass filter. This high IF bandpass filter is usually implemented as either a surface acoustic wave (SAW) filter or a manually-tuned LC filter. The high IF bandpass filter passes a few channels, out of more than 100 channels in the television band. A second conversion brings this relatively narrowband signal composed of a few channels down to the standard television IF at about 40 MHz. A second SAW or LC filter eliminates the remaining undesired channels.

There are several advantages to the double-conversion tuner. First, a tracking filter is not required for image rejection. It is easier to obtain a high level of image rejection with the double-conversion approach, because a fixed surface acoustic wave and a fixed LC filter can be much more selective than a tracking LC filter. Second, by tuning coarsely with the first broad tuning local oscillator, and fine-tuning with the second narrow tuning local oscillator, the necessary complexity of both phase-locked loops can be substantially reduced.

The high IF bandpass filter, which is usually centered a few hundred megahertz above the upper limit of the television band, must be wide enough to pass the desired television channel under all conditions of center-frequency manufacturing tolerance; center-frequency temperature and other environmental drift; and the variability of the high IF center frequency due to coarseness in tuning the first local oscillator.

Each of the described high IF filters have disadvantages. A fixed LC filter is composed of lumped element capacitors and inductors. Variations in the values of these components and variations in the characteristics of the underlying substrate cause a shift in the filter's characteristics, center frequency, bandwidth, etc., during fabrication. To compensate, lumped element filters must be tuned after fabrication. Tuning raises the cost and complexity of the filter assembly process.

Surface acoustic wave (SAW) filters do not require post fabrication tuning. However, SAW filters are relatively expensive and costly to integrate into new circuit designs, and cannot be fabricated at generic printed circuit board facilities.

What is needed is a passive bandpass filter that exhibits high selectivity, low input return loss, low insertion loss, and good image channel rejection. This new filter should also be inexpensive, capable of manufacture at generic printed circuit board facilities and not require post fabrication tuning.

BRIEF SUMMARY OF THE INVENTION

The invention is a printed bandpass filter comprising an input, a bypass line, an output, and a plurality of resonators. The input, resonators, and output are coupled to provide a desired passband. The bypass line is weakly coupled to the input and the output to improve image rejection of the input signal. The filter is printed on a precision substrate that can be mounted on a motherboard. Use of the precision substrate mitigates variations in the filter and eliminates the need for post fabrication tuning. The resonators are quarter wavelength transmission lines laid out in a pattern and coupled to ground. The resonators become open circuits at a resonant frequency.

BRIEF DESCRIPTION OF THE FIGURES

The present invention is described with reference to the accompanying drawings. In the drawings, like reference numbers indicate identical or functionally similar elements. Additionally, the leftmost digit of a reference number identifies the drawing in which the reference number first appears.

DETAILED DESCRIPTION OF THE INVENTION

Example Tuner Application

Before describing the invention in detail, it is useful to describe an example tuner environment for the invention. The printed bandpass filter invention is not limited to the tuner environment that is described herein, as the bandpass filter invention is applicable to other tuner and non-tuner applications as will be understood to those skilled in the relevant arts based on the discussions given herein.

Figure 1:
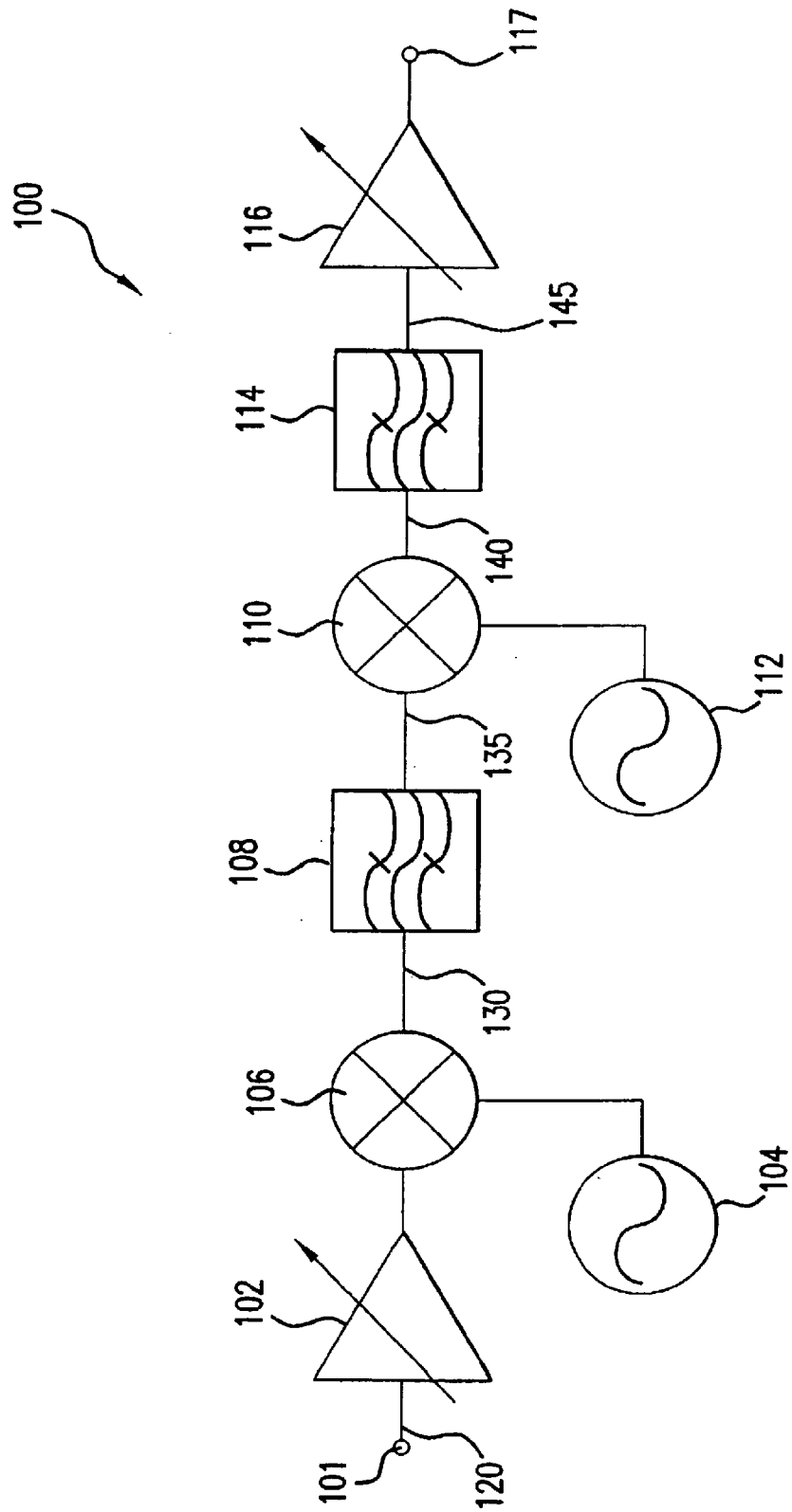
FIG. 1 illustrates a double conversion tuner.

FIG. 1 illustrates a double conversion tuner 100. The double conversion tuner 100 comprises a variable gain low noise amplifier 102 coupled to a first mixer 106 and a tuner input 101. The first mixer 106 is also coupled to a first local oscillator 104. A high IF bandpass filter 108 is coupled to the first mixer 106 and a second mixer 110. The second mixer 110 is coupled to a second local oscillator 112 and a second IF bandpass filter 114. A variable gain amplifier 116 is coupled to the second IF bandpass filter 114 and the tuner output 117.

The low noise amplifier 102 amplifies a radio frequency (RF) signal 120 present at the tuner input 101 and sends it to the first mixer 106. In an embodiment, the RF signal 120 is a television signal between approximately 50 and 850 megahertz. The first mixer 106 combines the RF signal 120 with the output of the first local oscillator 104 and outputs a high IF signal 130. The high IF signal 130 comprises a signal at approximately 1220 megahertz and an image channel component at approximately 1132 megahertz. The high IF bandpass filter 108 is a bandpass filter with its passband centered at approximately 1220 megahertz. The high IF signal 130 is filtered by the high IF bandpass filter 108. The high IF bandpass filter 108 removes the image channel component and most of the undesired television channels. After filtering, the high IF signal 130 becomes a high filtered IF signal 135. The high filtered IF signal 135 is mixed with the output of the second local oscillator 112 in the second mixer 110 to become a low IF signal 140. The low IF signal 140 comprises the television channels passed by the high IF bandpass filter 108 reduced in frequency to approximately 44 megahertz. The low IF signal 140, at approximately 44 megahertz, is a standard television IF used in the United States. An embodiment of the double conversion tuner 100, for use in Europe, produces the low IF final signal 140 at approximately 36 megahertz.

The second IF bandpass filter 114 removes the undesired television channels from the low IF signal 140 and outputs an IF signal 145. The IF signal 145 comprises the desired television channel and is sent to the variable gain amplifier 116 for amplification, then to the tuner output 117.

The Printed Bandpass Filter

This invention is a novel implementation of the high IF bandpass filter 108 using quarter wavelength resonators, coupled in parallel with a bypass line, and printed on a precision substrate.

Figure 2:
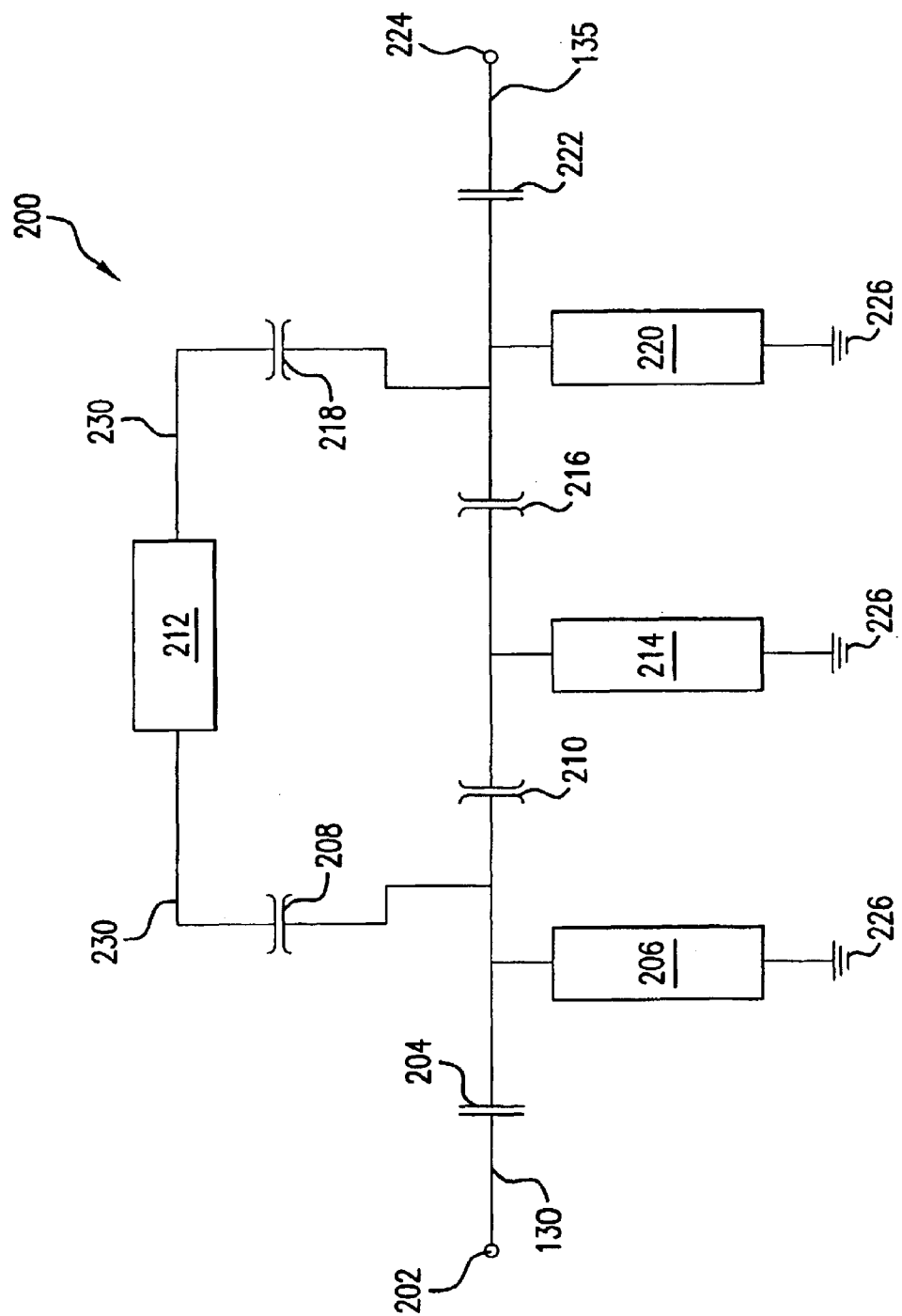
FIG. 2 illustrates a schematic of the bandpass filter according to the present invention.

FIG. 2 illustrates an electrical schematic of a bandpass filter 200 according to the present invention. Referring to FIG. 2, the bandpass filter 200 comprises an input capacitor 204 coupled to a filter input 202, a bypass line input coupler 208, a first resonator 206, and a first intercoupler 210. The first intercoupler 210 is coupled to a second intercoupler 216, and a second resonant element 214. The second intercoupler 216 is coupled to a bypass output coupler 218, a third resonator 220, and an output capacitor 222. A bypass line 212 is coupled to the bypass line input coupler 208 and the bypass line output coupler 218. The output capacitor 222 is coupled to the filter output 224. The first resonator 206, the second resonator 214, and the third resonator 220 are coupled to a ground 226.

The ground 226 is located beneath the bandpass filter 200. The printed metal traces comprising the input capacitor 204, first resonator 206, first intercoupler 210, second resonator 214, second intercoupler 216, third resonator 220, output capacitor 222, bypass line input coupler 208, bypass line output coupler 218, and bypass line 212 are microstrip transmission lines. Other equivalent transmission lines could be used. In one embodiment, the input capacitor 204 and the output capacitor 222 are printed finger capacitors. Printed finger capacitors are used to provide stronger capacitive coupling than is possible with transmission lines. The finger capacitors are simpler and less expensive than discreet surface mount capacitors and can be used on a single layer printed circuit board. The finger capacitors provide the necessary coupling capacitance without increasing the cost or complexity of the bandpass filter 200. Capacitors, other than finger, could be utilized as would be understood by those skilled in the art.

Adjusting the lengths of each resonator along with the inductive and capacitive characteristics of the coupled transmission lines, by incrementally adjusting the spacing, shape and width of each element results in a filter passband centered at a desired frequency and exhibiting a flat frequency response through the passband. The length, width, spacing and proximity to ground of the resonators and the transmission lines coupling the signal to and from the resonators determine the frequency response of the filter. If the printed circuit manufacturing process is well controlled, the physical dimensions of the resonators will not vary and post fabrication tuning will not be necessary.

Rejection of the image channel component in the high IF signal 130 can be improved by increasing the number of resonators in the filter. However, adding additional resonators will increase the signal insertion loss and the physical size of the filter.

In this invention, high IF signal 130 passes from the filter input 202 through the input capacitor 204, the first intercoupler 210, and the second intercoupler 216. The bypass line input coupler 208 couples a bypass line signal 230 from the high IF signal 130 and feeds the delayed signal 230 forward through the bypass line 212 to the bypass line output coupler 218. The bypass line input coupler 208, the bypass line output coupler 218, the first intercoupler 210, and the second intercoupler 216 each comprise a pair of coupled transmission lines. A coupled transmission line can provide both inductive and capacitive coupling. By carefully selecting the physical size and spacing of the bypass line 212, the input capacitor 204, the bypass line input coupler 208, the bypass line output coupler 218, the first intercoupler 210, the second intercoupler 216, and the output capacitor 222, the bypass line signal 230 is modified to be approximately equal in amplitude and opposite in phase to the image channel component of high IF signal 130. The output bypass line coupler 218 couples the bypass line signal 230 with the high IF signal 130, substantially attenuating the image channel component in the high IF signal 130 and sending the high filtered IF signal 135 through output capacitor 222 to the filter output 224. This novel feed forward feature increases image channel rejection by the printed bandpass filter 200 without significantly increasing the filter's insertion loss, physical size or component complexity.

Additional embodiments of the bandpass filter 200 can attenuate components of the high IF signal 130 at frequencies other than the image channel frequency. This capability is built in to the bandpass filter 200 and provides means to further improve the filtered high IF signal 135 quality.

Figure 3A:
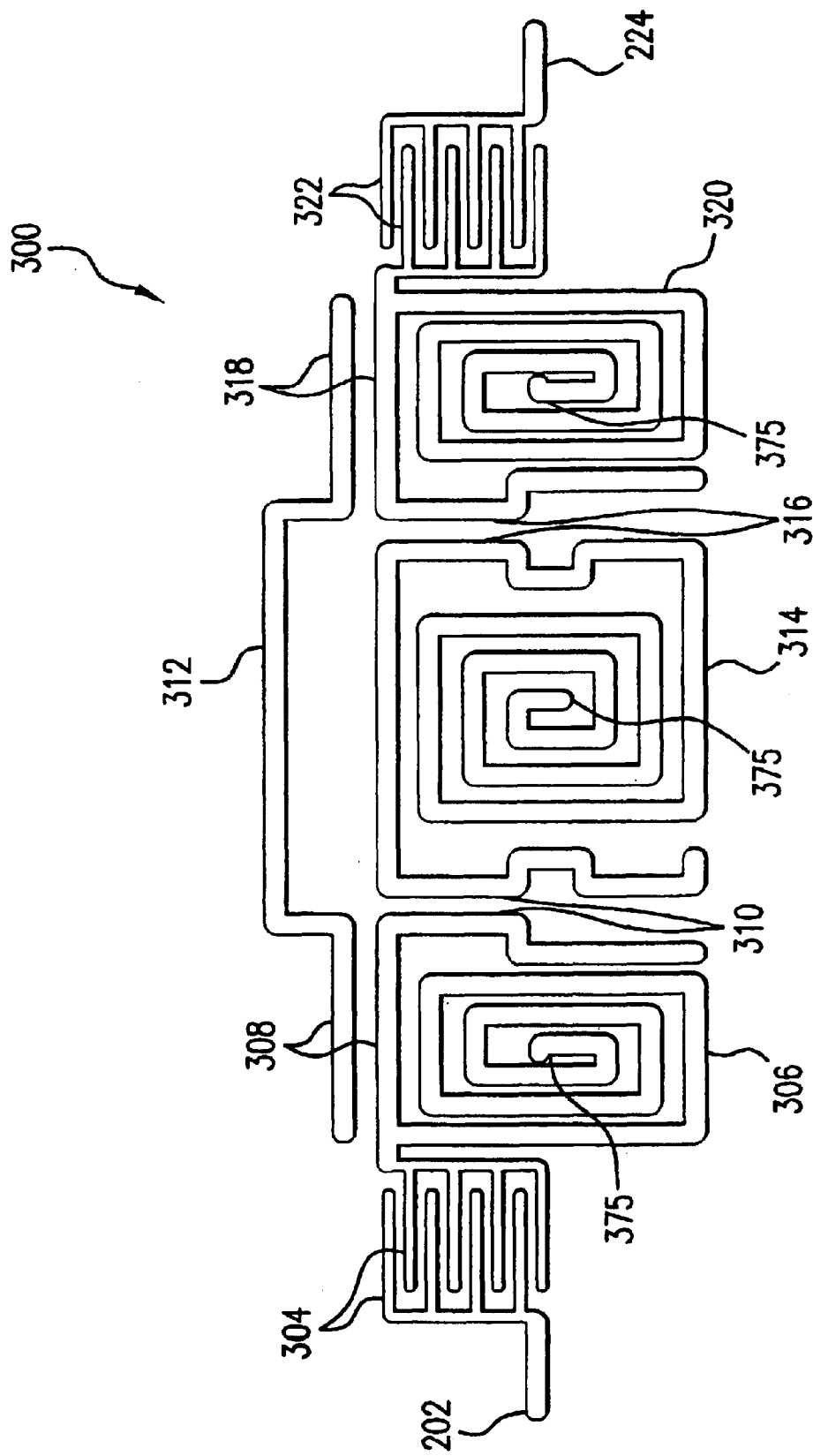
FIG. 3A illustrates a printed circuit embodiment of the bandpass filter.

FIG. 3A illustrates a printed bandpass filter 300 which is a printed version of the bandpass filter 200. Referring to FIG. 3A, the printed bandpass filter 300 comprises an input capacitor 304 coupled to the filter input 202, a bypass line input coupler 308, a first resonator 306, and a first intercoupler 310. The first intercoupler 310 is coupled to a second intercoupler 316, and a second resonator 314. The second intercoupler 316 is coupled to a bypass line output coupler 318, a third resonator 320, and an output capacitor 322. A bypass line 312 is coupled to the bypass line input coupler 308 and the bypass line output coupler 318. The output capacitor 322 is coupled to the filter output 224.

The first resonator 306, the second resonator 314, and the third resonator 320 are coupled to a ground 360 (FIG. 3C) by vias 375a, 375b, and 375c. In the present embodiment, the via 375 is a plated-through hole, electrically connecting portions of the printed filter 300 to the ground 360. One of skill in the art will understand that additional methods of coupling components in a printed circuit board are available and their use does not affect the invention described herein.

The input capacitor 304 and the output capacitor 322 are printed finger capacitors. The bypass line input coupler 308, the bypass line output coupler 318, the first intercoupler 310, and the second intercoupler 316 are electromagnetically coupled segments of microstrip transmission line. The bypass line input coupler 308, the bypass line output coupler 318, the first intercoupler 310, and the second intercoupler 316 form a distributed transmission line implementation of the weak capacitive couplings used in a lumped-element LC bandpass filter. Herein, weak capacitive coupling is the capacitance present in the coupled transmission lines.

In one embodiment this capacitance is on the order of 0.2 pF. However, other values of capacitance could be used as will be understood by one of ordinary skill in the relevant art.

In the printed filter 300, the ground 360 is located beneath the filter 300. The ground 360 provides the return path necessary for bypass line input coupler 308, the bypass line output coupler 318, the first intercoupler 310, the second intercoupler 316, the first resonator 306, the second resonator 314, and the third resonator 320 to function as microstrip transmission lines. Additional embodiments of this invention, with or without the ground 360 under the bandpass filter 200, can be implemented using coplanar waveguide transmission lines.

The bypass line 312 is a microstrip transmission line. The first resonator 306, the second resonator 314, and the third resonator 320 each comprise a microstrip transmission line that is shorted at one end. The shorted transmission line presents an open circuit to a signal applied at a resonant frequency.

Shorting each resonator reduces the resonant length from one-half to one-quarter the wavelength of the desired resonant frequency. The one-quarter wavelength microstrip transmission lines present an open-circuit at a resonant frequency, and together with the inherent weakly capacitive couplings are equivalent to a parallel LC tank circuit at the resonant frequency. To reduce the physical size of printed bandpass filter 300, the resonators are printed in the form of spirals on the substrate. Ideally, coupling between adjacent portions of the same resonator does not occur and the printed spiral is exactly one-quarter wavelength, of the desired resonant frequency, in size. Unfortunately, there is electromagnetic coupling between adjacent turns in each resonator spiral. To compensate for the undesired self coupling, the length of each resonator spiral is adjusted to become an open circuit through the desired passband. Therefore, in the present embodiment, the first resonator 306, second resonator 314, and the third resonator 320 are approximately one quarter wavelength in length. In the present invention, a quarter-wavelength resonator is a resonator, coupled to ground on one end and becoming an open circuit at the chosen resonant frequency.

The bypass line input coupler 308 comprises an outer segment of the printed trace forming the first resonator 306 and a segment of the printed trace forming the bypass line 312. A signal in the first resonator 306 is coupled to the bypass line 312 by the electromagnetic coupling between these parallel trace segments of the first resonator 306 and the bypass line 312. Similarly, the bypass line output coupler 318 comprises an outer segment of the printed trace forming the third resonator 320 and a section of the printed trace forming the bypass line 312. The first intercoupler 310 comprises another outer segment of the trace forming the first resonator 306 and an outer segment of the trace forming the second resonator 314. And, the second intercoupler 316 comprises an outer segment of the trace forming the second resonator 314 and an outer segment of the trace forming the third resonator 320.

The physical characteristics, trace width, length, and spacing, of the bypass line 312, the input capacitor 304, the bypass line input coupler 308, the bypass line output coupler 318, the first intercoupler 310, the second intercoupler 316, and the output capacitor 322 are selected to cause the bypass line signal 230 to be approximately equal in amplitude and opposite in phase to the image channel component of high IF signal 130.

Coupling effects between segments of the spirals are minimized through adequate spacing, and the residual effects are modeled with finite-element electromagnetic simulation software, such as IE3D (Zeland Software), SONNET (SONNET Software), Microwave Office (Applied Wave Research) and Ensemble and HFSS (ANSOFT Corp., Pittsburgh, Pa.).

The physical arrangement of transmission lines in relation to each other and to electrical ground, determines whether the transmission line is classified as a coplanar waveguide or as a microstrip transmission line. Either type of transmission line can be used in the present invention to achieve the size, simplicity and performance benefits discussed above.

Impedance and electrical length determine the properties of a quarter-wavelength resonator. Using a precision substrate material with well-controlled electrical and mechanical properties, i.e., dielectric constant, thickness, and dimensional stability, allows the circuit designer to control the filter's electrical characteristics very tightly. In one embodiment, the substrate material chosen is GML-1000 (GIL Technologies, Collierville, Tenn.). Persons of skill in the art will recognize additional substrate materials that can be substituted to provide equivalent mechanical and electrical properties.

Controlling the substrate's electrical and mechanical properties makes the filter less susceptible to variations in the manufacturing process. It helps ensure repeatable behavior in the intercoupler sections, the bypass line input coupler and bypass line output coupler sections, and in the bypass line itself. Repeatability means the variations in electrical characteristics found in a lumped element bandpass filter are not present in the printed bandpass filter. As a result, there is no need to tune the present invention after fabrication. Eliminating the necessity to tune the filter between manufacture and installation is a significant reduction in manufacturing expense.

Resonator to resonator coupling is accomplished by placing short segments of the resonators in close proximity to each other. This technique is also used to couple the bypass line 312 in the printed filter 300 using bypass line input coupler 308 and bypass line output coupler 318. Coupling the filter input 202 and the filter output 224 to the printed filter 300 requires stronger coupling than can be achieved with transmission lines. Therefore, finger capacitors are used for the input capacitor 304 and the output capacitor 322. The electrical properties of these capacitors are also well controlled if the substrate electrical and mechanical properties are well controlled.

Figure 3B:
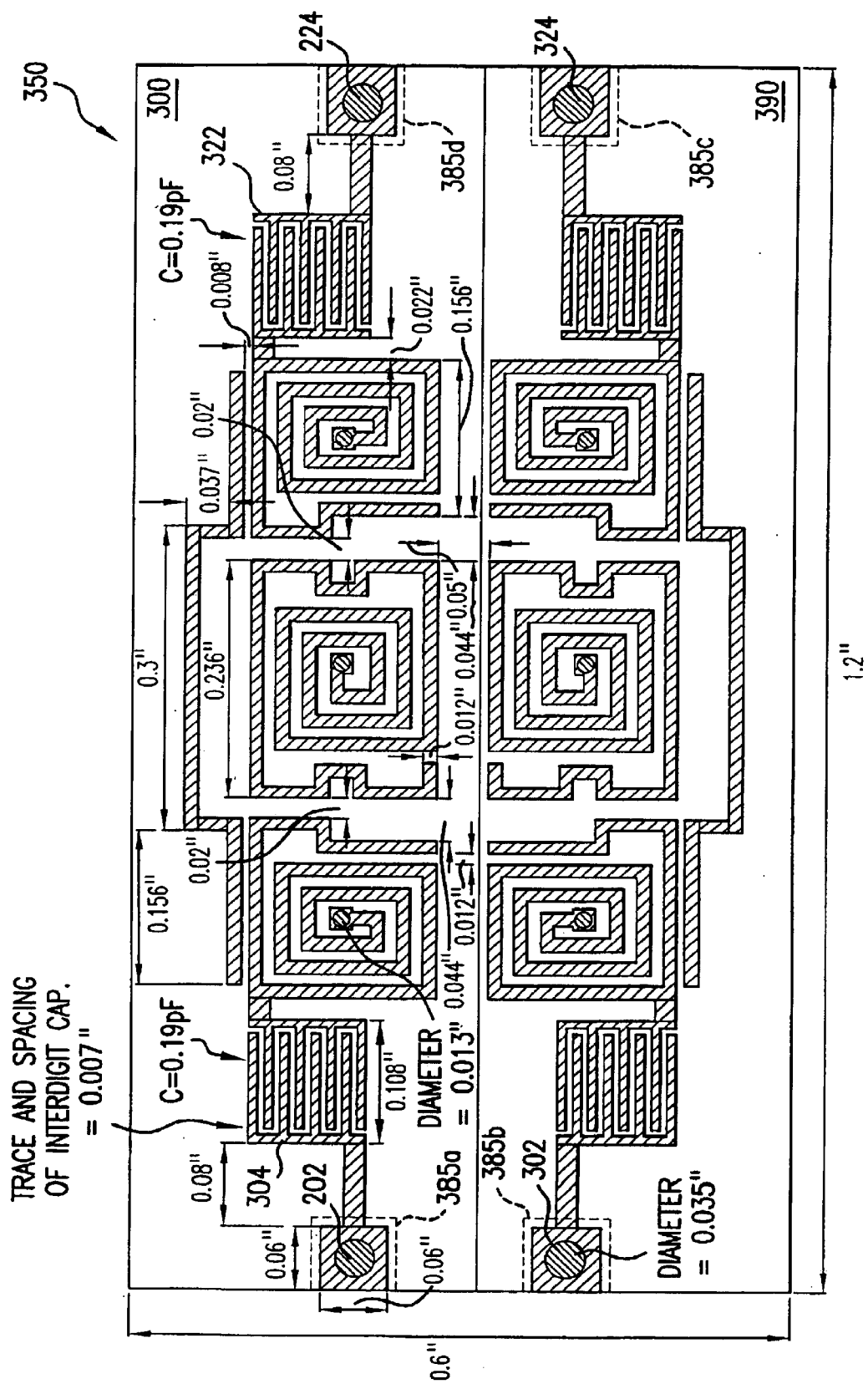
FIG. 3B illustrates a printed bandpass filter for use in differential signal applications.

FIG. 3B illustrates a differential bandpass filter 350. The differential bandpass filter 350 comprises the printed bandpass filter 300 and a second printed bandpass filter 390. The second printed bandpass filter 390 comprises the mirror image of the printed bandpass filter 300, a second filter input 302 and a second filter output 324. The printed bandpass filter 300 and the second printed bandpass filter 390 are printed on the same substrate in a manner to allow a differential signal to be applied to the filter input 202 and the second filter input 302. The filtered differential signal is output at the filter output 224 and the second filter output 324. The second printed bandpass filter 390 functions similarly to the printed bandpass filter 300. The differential bandpass filter 350 enables a balanced signal to be used in tuner 100. A balanced signal exhibits higher dynamic range, higher bandwidth, and lower pick-up and generation of interference noise than an unbalanced signal.

Figure 3C:
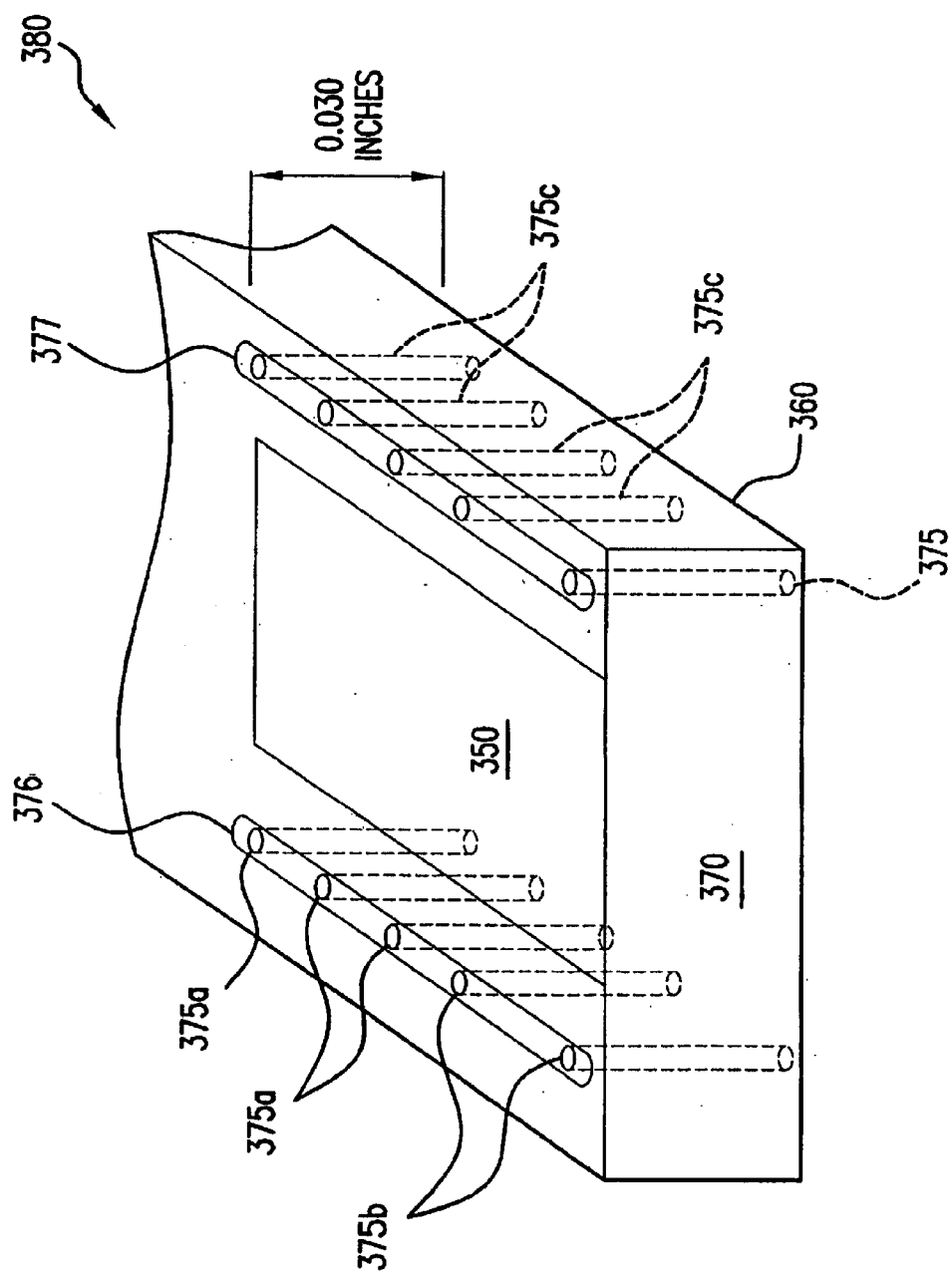
FIG. 3C illustrates details of a bandpass filter printed on a precision substrate.

FIG. 3B also illustrates the required trace widths, trace lengths and trace spacings for an embodiment of the printed bandpass filter 300. The input capacitor 304 and the output capacitor 322 have calculated values of 0.19 pF. The differential bandpass filter 350 has a Bandwidth of 1199~1240 M, an insertion loss of −3 dB, a differential input and differential output impedance of 200 ohms and an image rejection of >40 dB. FIG. 3B also illustrates one limitation on the ground 360, printed on the opposite side of a substrate 370 (FIG. 3C). The ungrounded zones 385a, 385b, 385c, and 385d are areas where the ground 360 is excluded to allow the high IF signal 130 and the filtered high IF signal 135 to be coupled to and from the differential bandpass filter 350.

FIG. 3C illustrates a three-dimensional view of a printed filter assembly 380. Referring to FIG. 3C, the filter assembly 380 comprises a precision substrate 370, the differential bandpass filter 350 printed on the upper side of the precision substrate 370, and a ground 360 printed on the lower side of the precision substrate 370. The ground 360 is a metal pattern placed on the precision substrate 370 opposite the side the differential bandpass filter 350 is placed. One method of coupling the ground 360 to the differential bandpass filter 350 is by the via 375. Referring to FIG. 3A, the first resonator 306, the second resonator 314 and the third resonator 320 are coupled to the ground 360 by vias 375a, 375b, and 375c respectively.

The proximity of the differential bandpass filter 350 and the ground 360 can cause a waveguide like effect in the precision substrate 370. This effect results in some portion of high IF signal 130 bypassing the differential bandpass filter 350 and increasing the out of band signal strength at filter output 224 and 324. This effect is undesirable.

FIG. 3C also illustrates a plurality of vias 375 coupled between the ground 360, a first blocking strip 376 and a second blocking strip 377. The vias 375, the blocking strips 376 and 377 and the ground 360 act as shields to greatly reduce the IF signal leaking into the substrate.

Figure 4A:
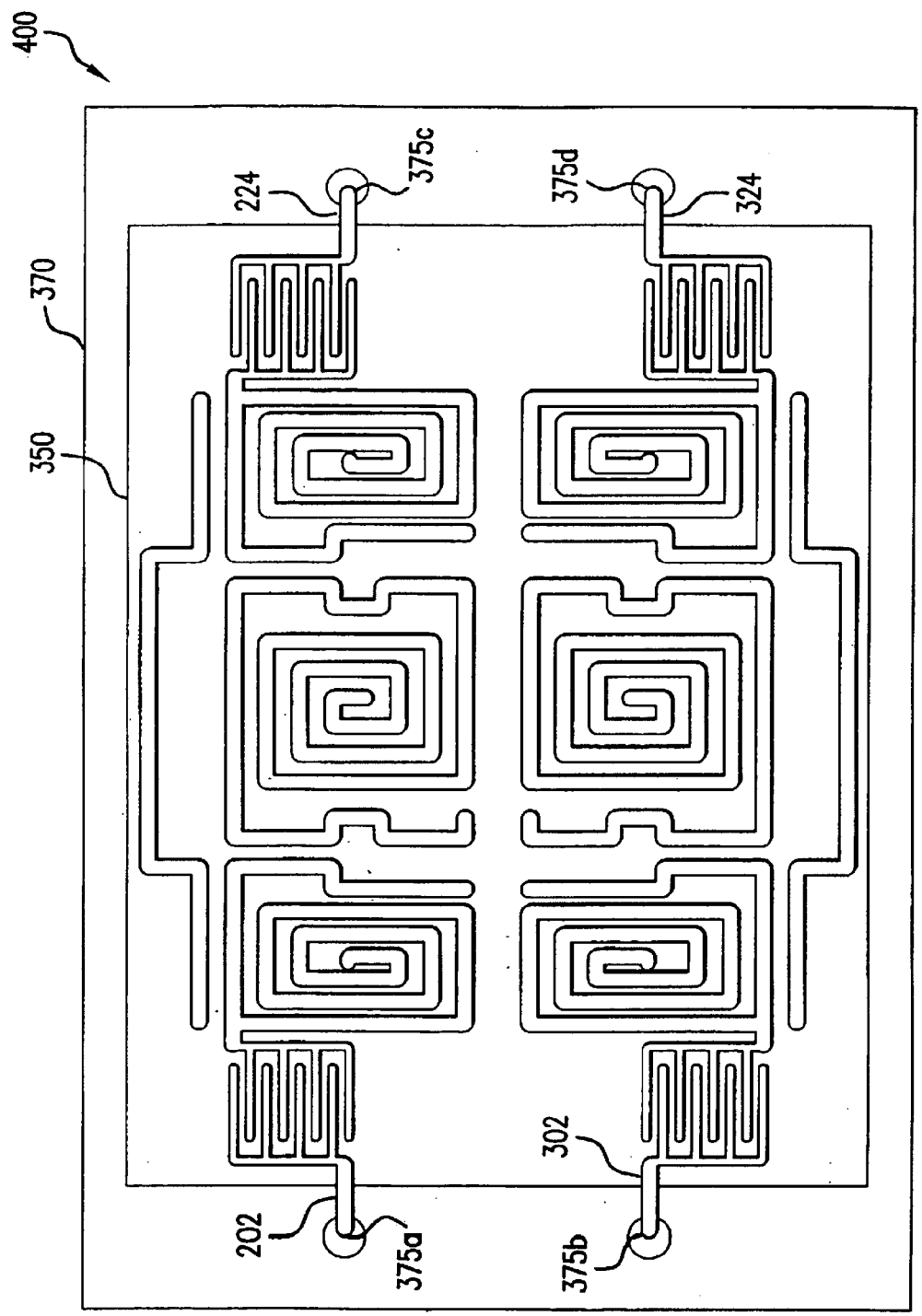
FIG. 4A illustrates the connections for attaching the printed filter assembly to a second printed circuit board.
Figure 4B:
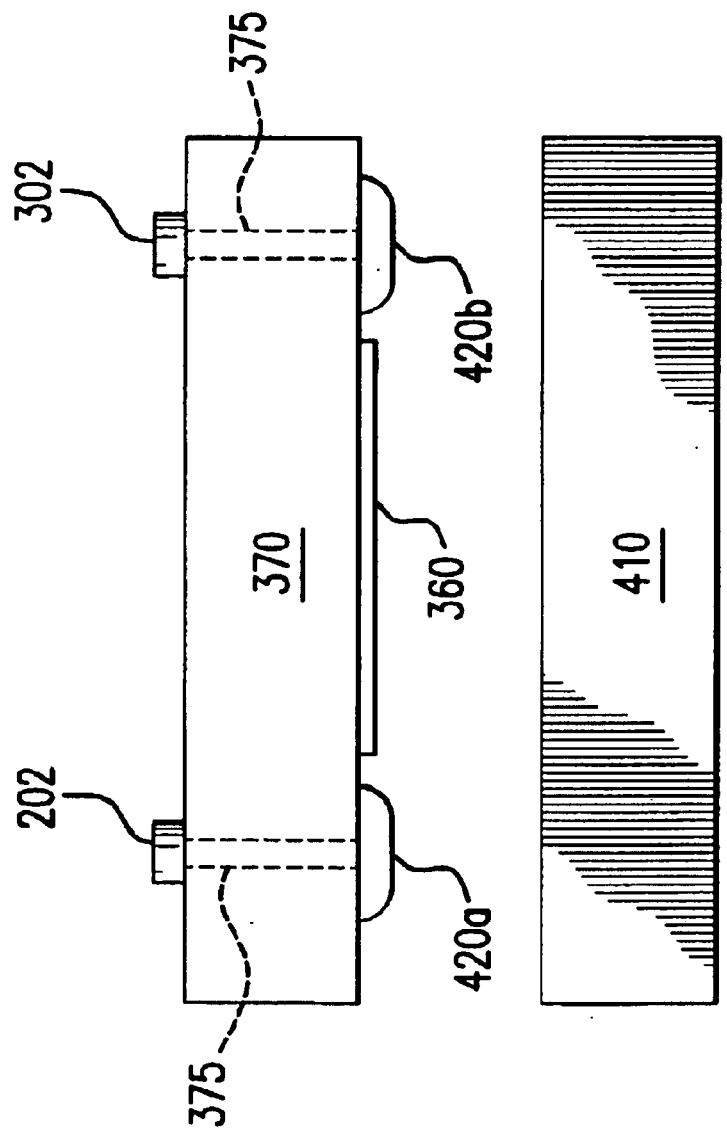
FIG. 4B illustrated details of connecting the printed filter assembly to a second printed circuit board.

FIGS. 4A and 4B illustrate the differential bandpass filter 350 connections used when printed filter assembly 380 is mounted on a second printed circuit board 410 (FIG. 4B). The second printed circuit board 410 incorporates elements of the tuner 100, and possibly other circuits, which are part of a larger assembly, including the tuner 100. The filter input 202, the filter second input 302, the filter output 224 and the second filter output 324 are connected to vias 375a, 375b, 375c, and 375d respectively. The vias 375 are connected to the bottom (opposite) side of the precision substrate 370.

FIG. 4B further illustrates a land pattern 420 used to connect the differential bandpass filter 350 to the second printed circuit board 410. Coupling the printed filter assembly 380 to the second printed circuit board 410 eliminates the need to use the relatively expensive precision substrate 370 for the second printed circuit board 410.

Referring to FIG. 4B, the via 375a is coupled between the filter input 202 and the land pattern 420a. When the printed circuit assembly 380 is landed on the second printed circuit board 410, the land pattern 420a couples the positive component of high IF signal 130 from the second printed circuit board 410 to the filter input 202. The via 375b is coupled between the second filter input 302 and the land pattern 420b. When landed, the land pattern 420b couples the negative component of high IF signal 130 from the second printed circuit board 410 to the second filter input 302. In a similar manner the via 375c is coupled between the filter output 224 and a corresponding (not shown) land pattern, and the via 375d is coupled between the second filter output 324 and a corresponding land pattern (not shown). Additional vias 375 and land patterns 420 are used as necessary to route additional connections between the printed filter assembly 380 and the second printed circuit board 410.

The land pattern 420 and the ground 360 coexist on the same side of the precision substrate 370. The land pattern 420 and the ground 360 are separated where necessary to couple a signal carrying element from the differential bandpass filter 350 to the land pattern 420. The land pattern 420 and the ground 360 are coupled where necessary to connect the ground 360 to the second printed circuit board 410.

In one embodiment, FR-4 is used for the printed circuit board 410. The precision substrate 370 has a slightly larger coefficient of thermal expansion than the printed circuit board material (FR-4). The difference in thermal expansion coefficient causes repetitive thermal stresses to be applied to the solder connections between the printed filter assembly 380 and the second printed circuit board 410.

Figure 5:
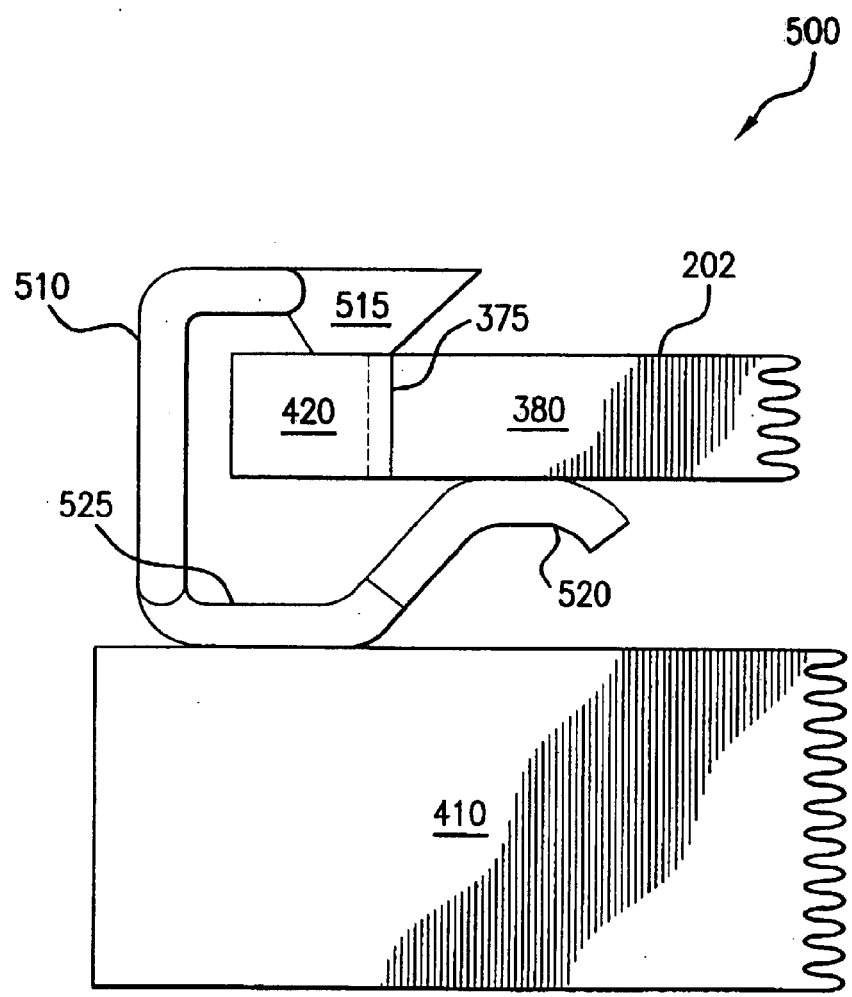
FIG. 5 illustrates the apparatus used to mount a printed bandpass filter assembly to another printed circuit board.

FIG. 5 illustrates an apparatus 500 for mitigating thermal cycling stress while maintaining the necessary electrical coupling between the differential bandpass filter 350 and the second printed circuit board 410. The apparatus 500 comprises a cup 515 coupled to a riser 510, to a base 525, and to a lower element 520. One example of the apparatus 500 is surface mount pin (model 34AC) by NAS Interplex, Flushing, N.Y.

In this example, the apparatus is connected to the filter input 202. Additional apparatus 500 can be connected, as described below, to provide thermal stress relief for any connection between the printed filter assembly 380 and the second printed circuit board 410. These connections comprise the second filter input 302, the filter output 224, the second filter output 324, and ground 360.

The cup 515 is connected to the filter input 202 and the lower element 520 is connected to the land pattern 420. The cup 515 is also coupled to via 375 which is coupled to land pattern 420. The apparatus 500 and the via 375 ensure a good electrical connection is maintained between the filter input 202 and the second printed circuit board 410. Any differential thermal expansion is absorbed by deflection of the riser 510 vice deflection of an affected solder connection.

Designing the Printed Bandpass filter

The detailed design of the filter is accomplished using numerical optimization techniques. First, the structure of the filter is described in terms of coupled microstrip lines and input and output coupling capacitances using the RF circuit simulator MMICAD (Optotek Ltd., Kanata, Ontario, Canada), or any equivalent microwave circuit simulator with an optimizer. Lengths of the resonator and coupling sections, spacing of the coupled sections, input and output coupling capacitors, and length of the bypass line are variables to be optimized (although approximate initial values were specified as a starting point). When an acceptable design was obtained using MMICAD, the filter's physical parameters were refined using electromagnetic finite-element simulation, as described above.

Figure 6:
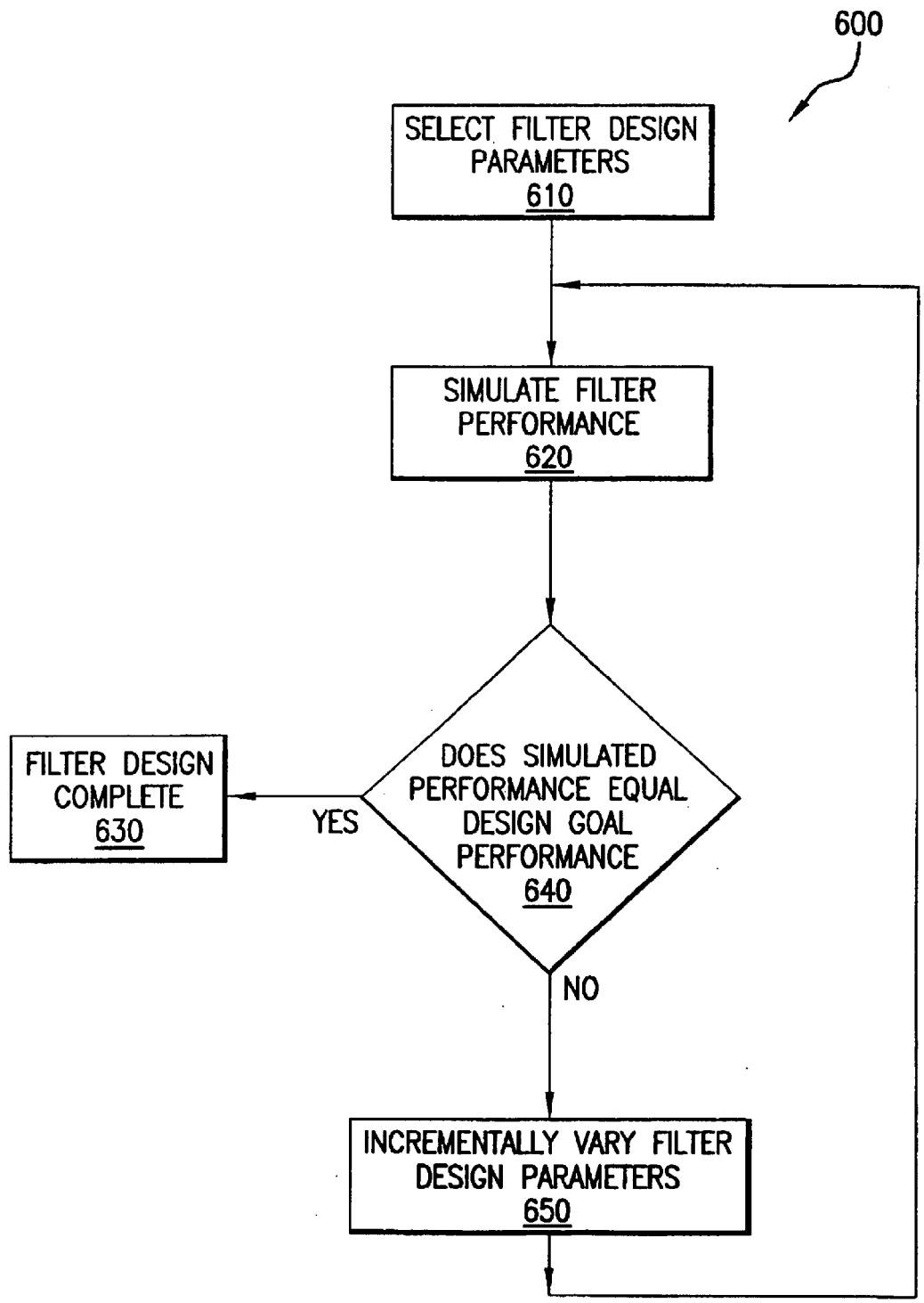
FIG. 6 is a flow chart illustrating the steps used in designing a printed bandpass filter.

FIG. 6 illustrates the steps of a method for printed bandpass filter design 600. In step 610, the variable fitter design parameters used in the design are selected. In step 620, printed bandpass filter performance is simulated. In step 640, if simulated printed bandpass filter performance is equal to the filter design goal performance, step 630 is performed. If printed bandpass filter simulated performance is different from filter design goal performance, step 650 is performed. In step 630, the filter design is complete. In step 650, the filter design parameters are incrementally varied in a manner to cause the simulated printed filter performance to approach the design goal performance. Steps 620, 640, and 650 are repeated until the simulated filter performance is equal to the design goal performance.

Conclusion

Example embodiments of the methods, systems, and components of the present invention have been described herein. As noted elsewhere, these example embodiments have been described for illustrative purposes only, and are not limiting. Other embodiments are possible and are covered by the invention. Such embodiments will be apparent to persons skilled in the relevant art based on the teachings contained herein. Thus, the breadth and scope of the present invention should not be limited by any of the above-described exemplary embodiments, but should be defined only in accordance with the following claims and their equivalents.

What is claimed is:

1. A bandpass filter, comprising:
a plurality of spiral resonators that are electromagnetically coupled to each other, each spiral resonator having a terminal coupled to a ground;
a bypass line in parallel with said plurality of spiral resonators, said bypass line having a bypass line input coupled to a first spiral resonator of said plurality of resonators and a bypass line output coupled to a second spiral resonator of said plurality of resonators;
an input, coupled to said first spiral resonator; and
an output, coupled to said second spiral resonator;
said bypass line input formed from an outer segment of said first spiral resonator that is in-parallel and electromagnetically coupled with a first portion of said bypass line, said bypass line output formed from an outer segment of said second spiral resonator that is arranged in-parallel and electromagnetically coupled with a second portion of said bypass line, a third portion of said bypass line coupled between said first portion and said second portion, wherein said first, second, and third portions of said bypass line have a substantially constant trace width, and wherein said third portion of said bypass line is electromagnetically isolated from at least one of said plurality of spiral resonators that are between said first spiral resonator and said second spiral resonator.

2. The bandpass filter of claim 1, wherein said spiral resonators are quarter wavelength transmission lines.

3. The bandpass filter of claim 2, wherein said quarter wavelength transmission lines are microstrip transmission lines.

4. The bandpass filter of claim 1, further comprising:
an input capacitor coupled between said input and said first spiral resonator; and
an output capacitor coupled between said output and said second spiral resonator.

5. The bandpass filter of claim 4, wherein said input capacitor and said output capacitor are printed finger capacitors.

6. The bandpass filter of claim 4, further comprising:
a bypass line input coupler, coupled between said bypass line and said first spiral resonator; and
a bypass line output coupler, coupled between said bypass line and said second spiral resonator.

7. The bandpass filter of claim 6, wherein said plurality of spiral resonators includes a third spiral resonator coupled between said first spiral resonator and said second spiral resonator.

8. The bandpass filter of claim 7, further comprising:
a substrate, wherein said plurality of spiral resonators, said bypass line, said input capacitor, said output capacitor, said bypass line input coupler, and said bypass line output coupler are printed on said substrate.

9. The bandpass filter of claim 7, further comprising:
a first intercoupler that weakly couples said first spiral resonator to said third spiral resonator; and
a second intercoupler that weakly couples said third spiral resonator to said second spiral resonator.

10. The bandpass filter of claim 1, wherein an input impedance and an output impedance are a desired value.

11. A bandpass filter comprising:
an input coupled to an input capacitor;
an output coupled to an output capacitor;
a first spiral resonator coupled to a ground, said input capacitor, a first intercoupler and a bypass line input coupler;
a second spiral resonator coupled to said ground, a second intercoupler, a bypass line output coupler, and said output capacitor;
a third spiral resonator coupled to said ground, said first intercoupler, and said second intercoupler, wherein said first spiral resonator, said second spiral resonator and said third spiral resonator are electromagnetically coupled quarter wavelength transmission lines;
a bypass line coupled between said bypass line input coupler and said bypass line output coupler, wherein said bypass line has a length configured to produce a signal that attenuates an image channel at said output and therefore causes improved image channel rejection at said output; and
a substrate, wherein said first spiral resonator, said second spiral resonator, said third spiral resonator, said bypass line, said input capacitor, said output capacitor, said bypass line input coupler, and said bypass line output coupler are printed on said substrate;
said bypass line input coupler formed from an outer segment of said first spiral resonator that is in-parallel with a first portion of said bypass line, said bypass line output coupler formed from an outer segment of said second spiral resonator that is arranged in-parallel with a second portion of said bypass line, a third portion of said bypass line coupled between said first portion and said second portion, wherein said first, second, and third portions of said bypass line have a substantially constant trace width.

12. The bandpass filter of claim 11, wherein said input capacitor and said output capacitor are printed finger capacitors.

13. The bandpass filter of claim 11, wherein said signal produced by said bypass line is out-of-phase with said image channel.

14. A differential bandpass filter, comprising:
- a plurality of spiral resonators that are electromagnetically coupled to each other, each spiral resonator having a terminal coupled to a ground;
- a first bypass line, in parallel with said plurality of spiral resonators, said bypass line having a bypass line input coupled to a first spiral resonator and a bypass line output coupled to a second spiral resonator;
- a first input, coupled to said first spiral resonator;
- a first output, coupled to said second spiral resonator;
- a second plurality of spiral resonators that are electromagnetically coupled to each other, each spiral resonator having a terminal coupled to said ground;
- a second bypass line, in parallel with said second plurality of spiral resonators, said second bypass line having a second bypass line input coupled to a third spiral resonator and a second bypass line output coupled to a fourth spiral resonator;
- a second input, coupled to said third spiral resonator; and
- a second output, coupled to said fourth spiral resonator;
- said first bypass line input formed from an outer segment of said first spiral resonator that is in-parallel and electromagnetically coupled with a first portion of said first bypass line, said first bypass line output formed from an outer segment of said second spiral resonator that is arranged in-parallel and electromagnetically coupled with a second portion of said first bypass line, a third portion of said first bypass line coupled between said first portion and said second portion of said first bypass line, wherein said first, second, and third portions of said first bypass line have a substantially constant trace width, and wherein said third portion of said first bypass line is electromagnetically isolated from at least one of said plurality of spiral resonators that are between said first spiral resonator and said second spiral resonator;
- said second bypass line input formed from an outer segment of said third spiral resonator that is in-parallel and electromagnetically coupled with a first portion of said second bypass line, said second bypass line output formed from an outer segment of said fourth spiral resonator that is arranged in-parallel and electromagnetically coupled with a second portion of said second bypass line, a third portion of said second bypass line coupled between said first portion and said second portion of said second bypass line, wherein said first, second, and third portions of said second bypass line have a substantially constant second trace width, and wherein said third portion of said second bypass line is electromagnetically isolated from at least one of said plurality of spiral resonators that are between said third spiral resonator and said fourth spiral resonator; and
- said first input and said second input forming a differential input capable of receiving a differential signal, said first output and said second output forming a differential output capable of producing a differential signal.

15. A double conversion tuner, comprising:
- a tuner input;
- a first variable gain amplifier, coupled to said tuner input;
- a first mixer coupled to a first local oscillator and said first variable gain amplifier;
- a printed bandpass filter, coupled between said first mixer and a second mixer, including
  - a plurality of spiral resonators that are electromagnetically coupled to each other, each spiral resonator having a terminal coupled to a ground;
  - a bypass line, in parallel with said plurality of spiral resonators, said bypass line having a bypass line input coupled to a first spiral resonator and a bypass line output coupled to a second spiral resonator;
  - said bypass line input formed from an outer segment of said first spiral resonator that is in-parallel with a first portion of said bypass line, said bypass line output formed from an outer segment of said second spiral resonator that is arranged in-parallel with a second portion of said bypass line, a third portion of said bypass line coupled between said first portion and said second portion of said bypass line, wherein said first, second, and third portions of said bypass line have a substantially constant trace width, and wherein said bypass line has a length configured to produce a signal that attenuates an image channel at said bypass line output;
  - a bandpass filter input coupled to an output of said first mixer; and
  - a bandpass filter output coupled to an input of said second mixer;
- a second local oscillator, coupled to said second mixer;
- a second IF bandpass filter coupled to said second mixer and a second variable gain amplifier; and
- a tuner output, coupled to said second variable gain amplifier.

16. The double conversion tuner of claim 15, wherein said printed bandpass filter is a differential bandpass filter.

17. The double conversion filter of claim 15, wherein said signal produced by said bypass line is out-of-phase with said image channel.

* * * * *